United States Patent
Shin et al.

(10) Patent No.: US 11,171,187 B2
(45) Date of Patent: Nov. 9, 2021

(54) DISPLAY DEVICE AND MANUFACTURING METHOD THEREOF

(71) Applicant: Samsung Display Co., Ltd., Yongin-Si (KR)

(72) Inventors: Beom-Soo Shin, Hwaseong-si (KR); Suk Hoon Kang, Seoul (KR); Min-Jae Kim, Suwon-si (KR); Hee Ra Kim, Suwon-si (KR); Hong Yeon Lee, Suwon-si (KR)

(73) Assignee: Samsung Display Co., Ltd.

( * ) Notice: Subject to any disclaimer, the term of this patent is extended or adjusted under 35 U.S.C. 154(b) by 85 days.

(21) Appl. No.: 16/103,821

(22) Filed: Aug. 14, 2018

(65) Prior Publication Data
US 2019/0229162 A1    Jul. 25, 2019

(30) Foreign Application Priority Data

Jan. 25, 2018  (KR) .................. 10-2018-0009476

(51) Int. Cl.
*H01L 27/32* (2006.01)
*H01L 51/00* (2006.01)
*H01L 51/50* (2006.01)

(52) U.S. Cl.
CPC ...... *H01L 27/3246* (2013.01); *H01L 51/0005* (2013.01); *H01L 51/0012* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 2227/323* (2013.01); *H01L 2251/558* (2013.01)

(58) Field of Classification Search
CPC .............. H01L 27/3246; H01L 27/3283; H01L 27/3295
See application file for complete search history.

(56) References Cited

U.S. PATENT DOCUMENTS

| | | | |
|---|---|---|---|
| 2007/0065570 A1* | 3/2007 | Kugler | B41C 1/10 427/58 |
| 2014/0131673 A1* | 5/2014 | Kim | H01L 27/3248 257/40 |
| 2017/0236889 A1 | 8/2017 | Shi | |

FOREIGN PATENT DOCUMENTS

| | | |
|---|---|---|
| JP | 2010-108927 A | 5/2010 |
| JP | 4736676 B2 | 7/2011 |
| KR | 10-2011-0094458 A | 8/2011 |
| KR | 10-2016-0009400 A | 1/2016 |

* cited by examiner

*Primary Examiner* — Moazzam Hossain
*Assistant Examiner* — Stanetta D Isaac
(74) *Attorney, Agent, or Firm* — Innovation Counsel LLP

(57) ABSTRACT

A display device may include a substrate, a thin film transistor, a first electrode, a second electrode, and a barrier. The thin film transistor is disposed on the substrate. The first electrode is electrically connected to the thin film transistor. The second electrode overlaps the first electrode. The barrier has a first portion and a second portion. The second portion is disposed between the first portion and the second electrode and is fluorine-doped. A side surface of the first portion is part of a boundary of an opening of the barrier and is hydrophilic. The opening of the barrier is disposed between the first electrode and the second electrode.

8 Claims, 16 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2018-0009476 filed in the Korean Intellectual Property Office on Jan. 25, 2018; the entire contents of the Korean Patent Application are incorporated herein by reference.

BACKGROUND

(a) Technical Field

The technical field relates to a display device and a method for manufacturing the display device.

(b) Description of the Related Art

An inkjet printing device may discharge fine droplets at one or more locations on a printing medium. An inkjet printing device may be used in manufacturing a display device.

The above information disclosed in this Background section is for enhancement of understanding of the background of the application. The Background section may contain information that does not form the prior art that is already known in this country to a person of ordinary skill in the art.

SUMMARY

Embodiments may be related to a display device that includes a light emitting element layer of satisfactory quality. Embodiments may be related to a method for manufacturing the display device.

A display device according to an embodiment includes the following elements: a substrate; a thin film transistor that is disposed on the substrate; a first electrode that is connected with the thin film transistor; a second electrode that overlaps the first electrode; and a barrier that is disposed between the first electrode and the second electrode, wherein the barrier includes an opening that overlaps the first electrode, an upper surface of the barrier is fluorine-doped, and a side surface of an opening of the barrier is hydrophilic.

A thickness of the fluorine-doped area of the barrier may be about 10 nm to about 100 nm.

A ratio of the thickness of the fluorine-doped area of the barrier with respect to the entire thickness of the barrier may be about 0.05% to about 20%.

The barrier may include a first barrier and a second barrier that are sequentially stacked, the second barrier may be disposed closer to the second electrode than the first barrier, and an area of the second barrier, adjacent to the second electrode, may be fluorine-doped.

The first barrier and the second barrier may include the same material.

The first barrier and the second barrier may include different materials.

According to an embodiment, a method for manufacturing a display device is provided. The method includes the following steps: preparing a substrate that includes a thin film transistor and a first electrode connected to the thin film transistor; forming a second layer including fluorine on the substrate and a first layer disposed on the second layer; forming an opening that overlaps the first electrode by exposing and developing the second layer and the first layer; and removing the first layer by performing plasma treatment on the opening, the second layer, and the first layer.

A thickness of an area of the second layer, including fluorine, may be about 10 nm to about 100 nm.

In the forming of the opening that overlaps the first electrode by exposing and developing the second layer and the first layer, a thickness of the first layer may be reduced.

In the removing the first layer by performing the plasma treatment on the opening, the second layer, and the first layer, a side surface of the opening may have hydrophilicity.

In the removing the first layer by performing the plasma treatment on the opening, the second layer, and the first layer, residuals of the second layer and the first layer in the opening may be eliminated.

The plasma treatment may be carried out by using at least one of $O_2$, Ar, $N_2$, $NF_3$, and $CF_4$ The first layer and the first layer may include the same material, and the second layer may further include fluorine in addition to the material of the first layer.

The second layer and the first layer may include different materials.

The method may further include, in the forming of the second layer including fluorine on the substrate and the first layer disposed on the second layer, forming a third layer between the second layer and the first layer.

The third layer, the second layer, and the first layer may be formed on the substrate through coating and heating a material of the third layer, coating and heating a material of the second layer, and coating and heating a material of the first layer.

The first layer and the third layer may include the same material.

The method may further include forming at least one of an electron injection layer (EIL), an electron transport layer (ETL), an emission layer, a hole transport layer (HTL), and a hole injection layer (HIL) in the opening, through an inkjet process.

An embodiment may be related to a display device. The display device may include a substrate, a thin film transistor, a first electrode, a second electrode, and a barrier. The thin film transistor may be disposed on the substrate. The first electrode may be electrically connected to the thin film transistor. The second electrode overlaps the first electrode. The barrier has a first portion and a second portion. The second portion may be disposed between the first portion and the second electrode and may be fluorine-doped. A side surface of the first portion may be part of a boundary of an opening of the barrier and may be hydrophilic. The opening of the barrier may be disposed between the first electrode and the second electrode.

A thickness of the second portion in a direction perpendicular to the substrate may be in a range of 10 nm to 100 nm.

The first portion may not be fluorine-doped. A ratio of a thickness of the second portion in a direction perpendicular to the substrate with respect to a thickness of the barrier in the direction perpendicular to the substrate may be in a range of 0.05% to 20%.

A face of the second portion may directly contact the second electrode and may be fluorine-doped.

The first portion and the second potion may include a same material.

The first portion may include a first material. The second portion may include a second material different from each of fluorine and the first material.

An embodiment may be related to a method for manufacturing a display device.

The method may include the following steps: preparing a substrate that includes a thin film transistor and a first electrode electrically connected to the thin film transistor; forming a material layer on the substrate, wherein the material layer may include a fluorine-containing portion; forming a cover layer on the second layer; forming an opening that exposes the first electrode by partially removing the cover layer and the material layer; and removing remaining portions of the cover layer by performing plasma treatment.

A thickness of the fluorine-containing portion in a direction perpendicular to the substrate may be in a range of 10 nm to 100 nm.

In the forming of the opening, a thickness of the cover layer in a direction perpendicular to the substrate may be reduced.

After the remaining portions of the cover layer have been removed, a surface of a remaining portion of the material layer may surround the opening and may have hydrophilicity.

In the removing the remaining portions of the cover layer, residuals of the material layer and the cover layer in the opening may be eliminated.

Plasma used in the plasma treatment may include at least one of $O_2$, Ar, $N_2$, $NF_3$, and $CF_4$.

Both the material layer and the cover layer may include a first material. The material layer further may include fluorine in addition to the first material.

The material layer may include a first material and fluorine. The cover layer may include a non-fluorine material different from the first material.

The method may include forming an intermediate layer between the material layer and the substrate.

The intermediate layer, the material layer, and the cover layer may be formed on the substrate through coating and heating a material of the intermediate layer, subsequently coating and heating a material of the material layer, and subsequently coating and heating a material of the cover layer.

The cover layer and the intermediate layer may include a same material.

The method may include forming at least one of an electron injection layer (EIL), an electron transport layer (ETL), an emission layer, a hole transport layer (HTL), and a hole injection layer (HIL) in the opening, through an inkjet process.

According to the embodiments, a display device that can effectively form a light emitting element layer using an inkjet process, and a manufacturing method thereof can be provided.

DETAILED DESCRIPTION OF EMBODIMENTS

Figure 1:
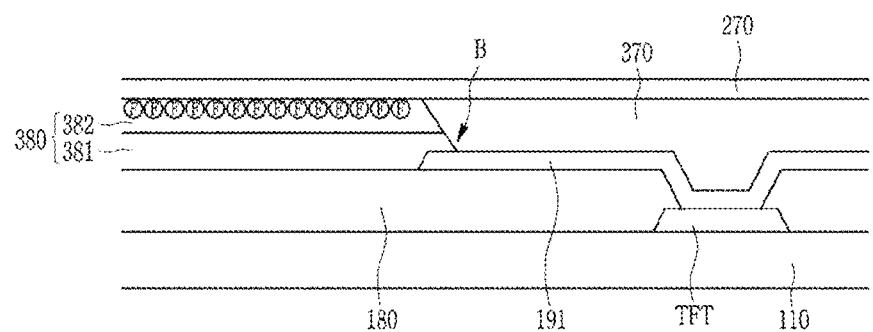
FIG. 1 schematically shows a cross-sectional view of a display device according to an embodiment.

Example embodiments are described with reference to the accompanying drawings. As those skilled in the art would realize, the described embodiments may be modified in various different ways.

The drawings and description are to be regarded as illustrative in nature and not restrictive. Like reference numerals may designate like elements.

In the drawings, sizes and thicknesses of elements may be represented for better understanding and ease of description. In the drawings, thicknesses of layers, films, panels, regions, etc., may be exaggerated for clarity and/or for convenience of description.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except environmental elements such as air) provided between the first element and the second element. The word "on" or "above" means positioned on or below an object, and does not necessarily mean positioned on the upper side of the object based on a gravitational direction.

Unless explicitly described to the contrary, the word "comprise" and variations such as "comprises" or "comprising" may imply the inclusion of stated elements but not the exclusion of any other elements.

The term "connect" may mean "electrically connect"; the term "insulate" may mean "electrically insulate"; the term "area" may mean "portion."

Figure 7:
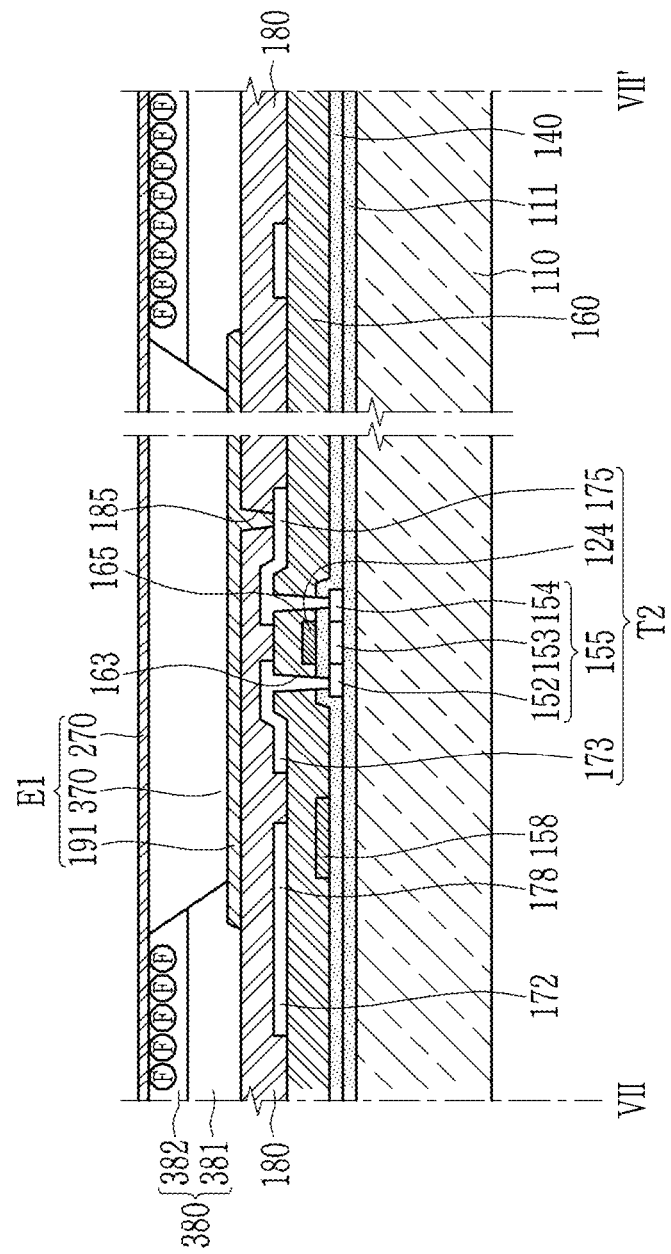
FIG. 7 is a cross-sectional view of the display device illustrated in FIG. 6, taken along the line VII-VII', according to an embodiment.

FIG. 1 and FIG. 7 schematically illustrate a display device according to an embodiment.

Referring to FIG. 1 and FIG. 7, a light emitting display device according to an embodiment includes a substrate 110, a thin film transistor TFT disposed on the substrate 110, a first electrode 191 connected with the thin film transistor TFT, a second electrode 270 overlapping the first electrode 191, a barrier 380 and a light emitting layer 370 that are disposed between the first electrode 191 and the second electrode 270, and an insulation layer 180 disposed between the thin film transistor TFT and the first electrode 191. The barrier 380 includes a first barrier 381 and a second barrier 382, and fluorine is included in an area/portion of the second barrier 382 where the second barrier 382 and the second electrode 270 are adjacent to each other. The area/portion where fluorine is included in the second barrier 382 is an upper area, and a side area of an opening B of the barrier 380 (or of the second barrier 382 and/or first barrier 381) is not doped with fluorine.

The barrier 380 may have a thickness in a range of about 0.5 μm to about 2 μm in a direction perpendicular to the substrate 110. In the barrier 380, the area doped with fluorine may have a thickness in a range of about 10 nm to about 100 nm in the direction perpendicular to the substrate 110. In an example, a ratio of the area/portion doped with fluorine with respect to the thickness of the whole barrier may be in a range of about 0.05% to about 20%.

The first barrier 381 and the second barrier 382 may include the same material or may include different materials. The first barrier 381 and the second barrier 382 may include negative photoresists.

A hole injection layer, a hole transport layer, an emission layer, an electron transport layer, and an electron injection layer included in the light emitting layer 370 in the display device may be formed through one or more inkjet processes.

In order to prevent an inkjet material from overflowing the barrier 380 in an inkjet process, an upper surface of the barrier 380 needs to be hydrophobic.

Figure 2:
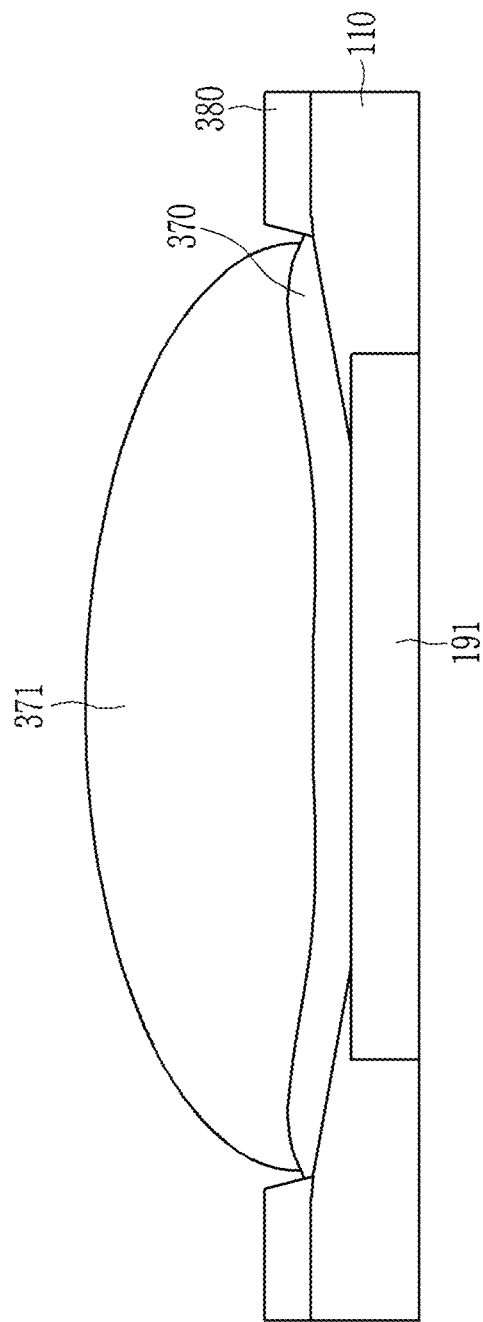
FIG. 2 shows a configuration (or a schematic cross-sectional view) in which an inkjet material stays within a barrier having hydrophobicity rather than overflowing due to the hydrophobicity of the barrier according to an embodiment.

FIG. 2 shows a configuration in which an inkjet material 371 stays only in the opening of the barrier 380 due to hydrophobicity of the barrier 380. The upper surface of the barrier 380 needs to be hydrophobic in order to form the light emitting layer only in the opening of the barrier 380 during an inkjet process. However, if a side surface of the barrier 380 has (too much) hydrophobicity, the inkjet material 371 cannot be sufficiently spread in the opening of the barrier 380.

Figure 3:
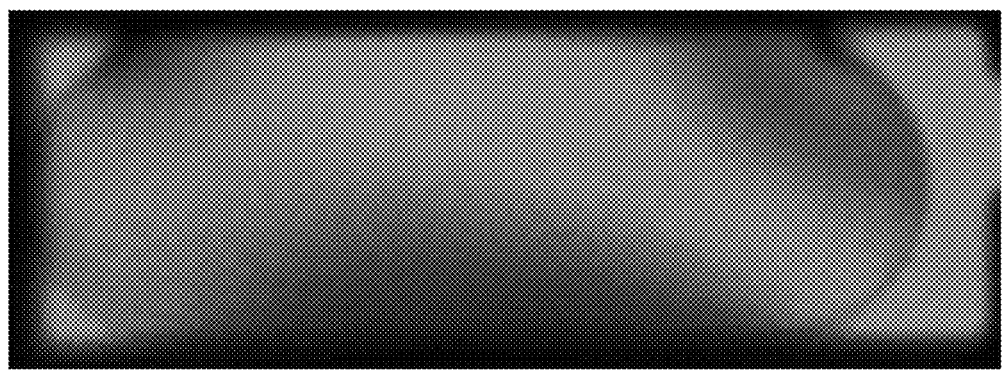
FIG. 3 is an image illustrating that an inkjet material overflows since a barrier does not have hydrophobicity according to an embodiment.
Figure 4:
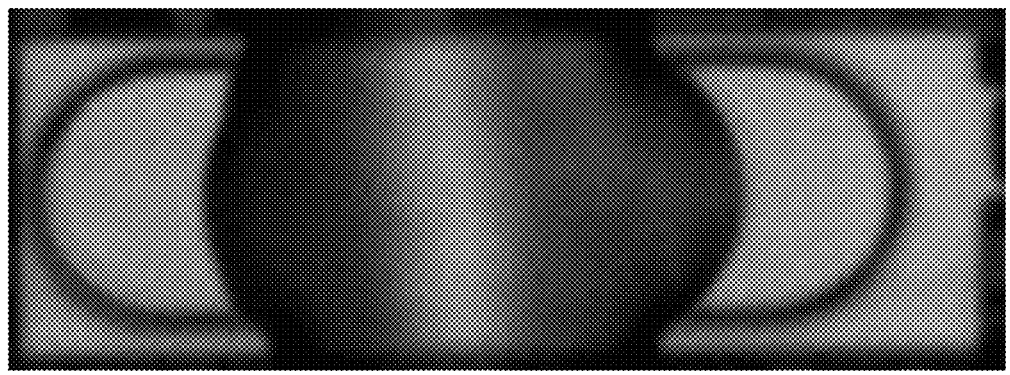
FIG. 4 is an image illustrating that an inkjet material is not sufficiently spread because the barrier is hydrophobic up to a side wall according to an embodiment.

FIG. 3 is an image showing that an inkjet material overflows because the upper surface of the barrier does not have (sufficient) hydrophobicity, and FIG. 4 is an image showing that an inkjet material does not sufficiently spread because the side surface of the barrier has (too much) hydrophobicity.

That is, the barrier needs to have proper hydrophobic and/or hydrophilic characteristics in order to make a material spread well and prevent overflowing.

Referring to FIG. 1 and FIG. 7, in the display device, the barrier 380 may include a double-layer structure, and an upper area/portion of the second barrier 382 disposed above has hydrophobicity because the upper area is doped with fluorine and side surfaces of the first and second barriers 381 and 281 may have hydrophilicity because they are not doped with fluorine may define one or more boundaries of the opening B.

Thus, the barrier 380 has hydrophilicity within the opening B, and the upper area, which is the outside the opening B, has hydrophobicity. When the layers included in the light emitting element layer 370 are manufactured through one or more inkjet processes in the opening B of the barrier 380, an inkjet material spreads well in the opening B due to hydrophilicity of the side surfaces of the barrier 380. Since the upper surface of the barrier 380 has hydrophobicity because of being doped with fluorine, the inkjet material can be prevented from overflowing. Accordingly, the light emitting element layer 370 can be effectively manufactured through the one or more inkjet processes.

Figure 5:
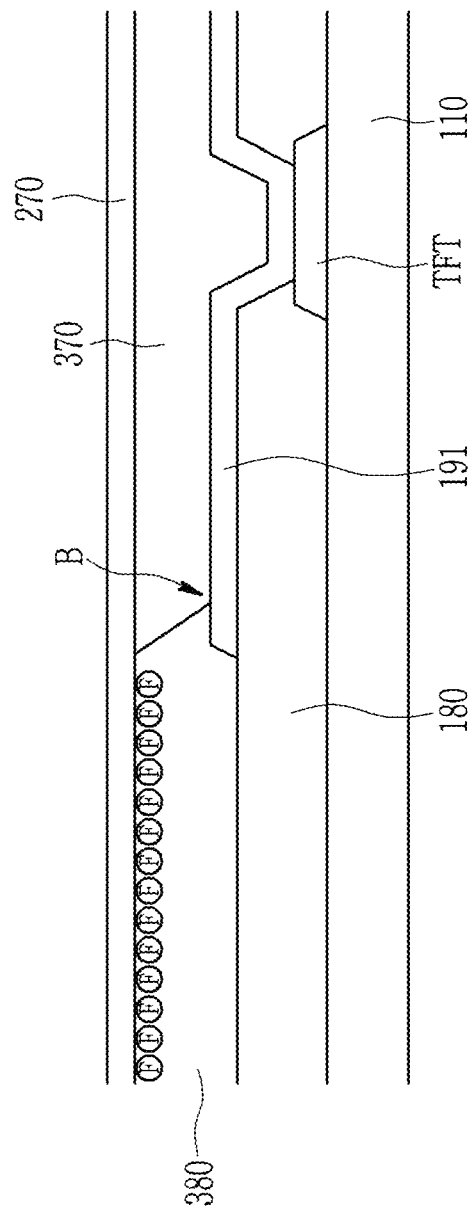
FIG. 5 shows a schematic cross-sectional view of a display device according to an embodiment.

FIG. 1 and FIG. 7 illustrate that the barrier 380 includes the first barrier 381 and the second barrier 382, but the barrier 380 may not include both layers 381 and 382. In an embodiment, the barrier 380 can provide the same effect if an upper surface of the barrier 380 has hydrophobicity by being fluorine-doped and a side surface of an opening has hydrophilicity. FIG. 5 shows a display device according to an embodiment. Referring to FIG. 5, the barrier 380 is provided as a single layer with a fluorine-doped top portion. A thickness of the fluorine-doped top portion may be in a range of about 0.05% to about 20% with respect to a thickness of the entire barrier 380 in a direction perpendicular to the substrate 110 and may have sufficient hydrophobicity. A side surface of the barrier 380 that defines a boundary of an opening B has hydrophilicity.

Figure 6:
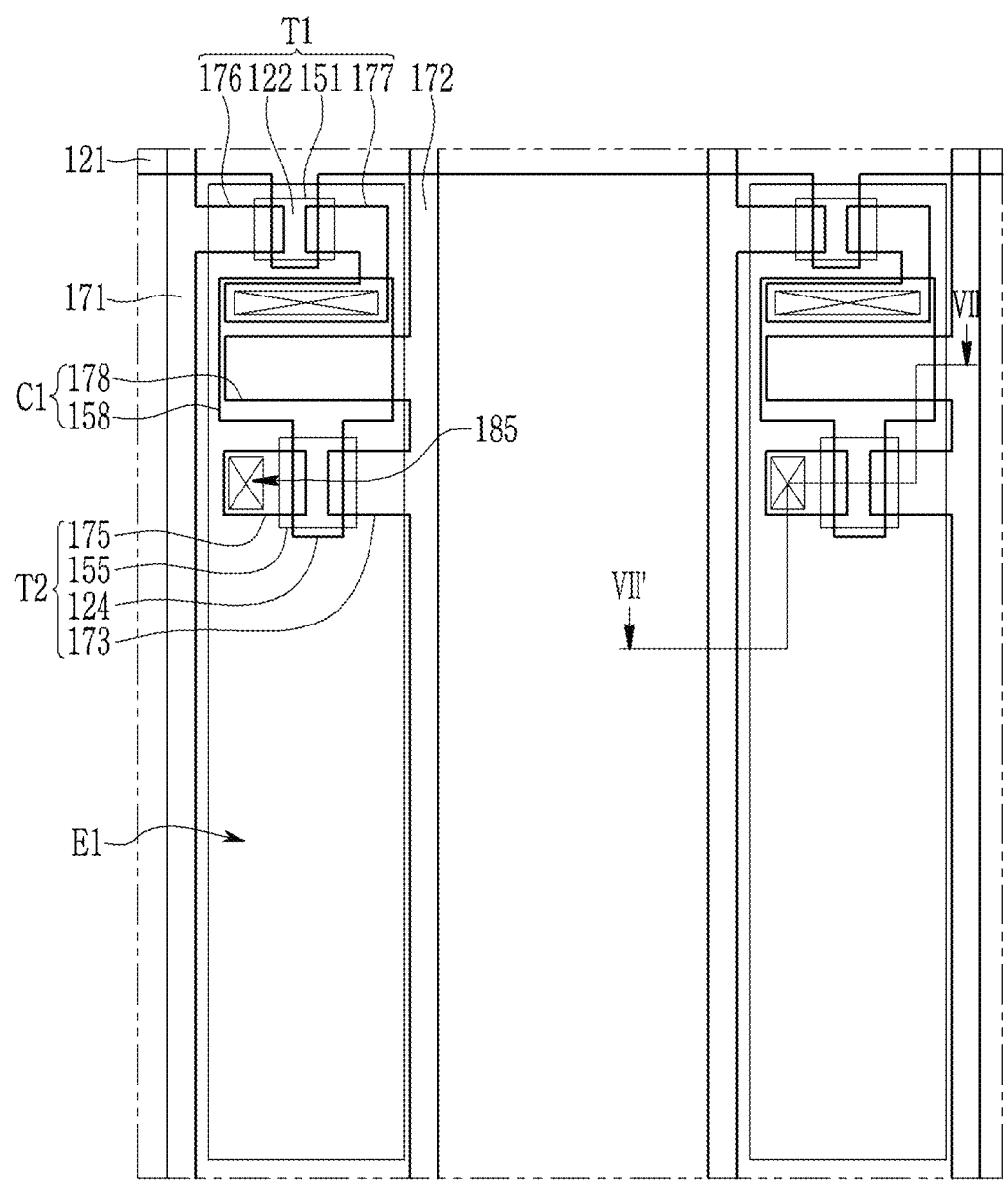
FIG. 6 is a schematic top plan view of a display device according to an embodiment.

FIG. 6 is a schematic top plan view of a display device according to an embodiment. FIG. 7 is a cross-sectional view of FIG. 6, taken along the line VII-VII'.

In an embodiment, an active matrix (AM) type of light emitting display is illustrated to have a 2Tr-1Cap structure in which two transistors (TFTs) and one capacitor are provided for each pixel of a display area.

In an embodiment, in the light emitting display device, each pixel may be provided with three or more transistors and two or more capacitors, and may be formed to have various structures by further forming additional wires. The pixel is a minimum unit for displaying an image, and the display area displays the image through the plurality of pixels.

Referring to FIG. 6 and FIG. 7, the light emitting display device includes a switching thin film transistor T1, a driving thin film transistor T2, a capacitor C1, and a light emitting element E1, which are formed in each of the plurality of pixels on the substrate 110. Gate lines 121 disposed along one direction, and data lines 171 and common power lines 172 that cross the gate lines 121 in an insulated manner, are disposed in the substrate 110. Here, each pixel may be defined by the boundary of the gate line 121, the data line 171, and the common power line 172, but this is not restrictive.

The organic light emitting element E1 includes the first electrode 191, the light emitting element layer 370 disposed on the first electrode 191, and the second electrode 270 disposed on the light emitting element layer 370.

In an embodiment, the first electrode 191 is a positive electrode, which is a hole injection electrode, and the second electrode 270 is a negative electrode, which is an electron injection electrode. In an embodiment, the first electrode 191 may be a negative electrode and the second electrode 270 may be a positive electrode depending on a driving method of the light emitting display device. The first electrode 191 may be a pixel electrode and the second electrode 270 may be a common electrode.

The light emitting element layer 370 may include at least one of a hole injection layer (HIL), a hole transport layer (HTL), an emission layer, an electron transport layer (ETL), and an electron injection layer (EIL). The emission layer may include an organic emission layer, and an exciton generated by coupling injected holes and electrons falls from an excited state to a ground state to emit light. In an embodiment, the emission layer may include quantum dots.

The capacitor C1 includes a pair of capacitor plates 158 and 178 and an interlayer insulating layer 160 interposed between the plates 158 and 178. The interlayer insulating layer 160 functions as a dielectric member. Capacitance is determined by charges charged in the capacitor C1 and a voltage between the pair of capacitor plates 158 and 178.

The switching thin film transistor T1 includes a switching semiconductor layer 151, a switching gate electrode 122, a switching source electrode 176, and a switching drain electrode 177. The driving thin film transistor T2 includes a driving semiconductor layer 155, a driving gate electrode 124, a driving source electrode 173, and a driving drain electrode 175.

The switching thin film transistor T1 is used as a switch to select a pixel for light emission. The switching gate electrode 122 is connected with the gate line 121 and the switching source electrode 176 is connected with the data line 171. The switching drain electrode 177 is disposed apart from the switching source electrode 176, while being connected with one (e.g., 158) of the pair of capacitor plates 158 and 178.

The driving thin film transistor T2 applies driving power to the first electrode 191 for light emission of the light emitting element layer 370 of the organic light emitting element E1 in the selected pixel. The driving gate electrode 124 is connected with the capacitor plate 158 to which the switching drain electrode 177 is connected. The driving source electrode 173 and the other capacitor plate 178 are respectively connected to the common power line 172.

The driving drain electrode 175 is connected to the first electrode 191 through a contact hole 185.

Referring FIG. 7, a buffer layer 111 is disposed on the substrate 110. The substrate 110 may be made of at least one of glass, quartz, ceramic, plastic, and the like. The buffer layer 111 may be made of at least one of a silicon nitride (SiNx), a silicon oxide (SiO$_x$), a silicon oxynitride (SiOxNy), and the like. Here, x and y may respectively be in a range of 1 to 5.

The driving semiconductor layer 155 is disposed on the buffer layer 111. The driving semiconductor layer 155 may be made of at least one of various semiconductor materials such as a polysilicon layer, an amorphous silicon layer, and the like. The driving semiconductor layer 155 may include a source region 152, a channel region 153, and a drain region 154.

A gate insulation layer 140 that is made of a silicon nitride or a silicon oxide is disposed on the driving semiconductor layer 155. The driving gate electrode 124 and the first capacitor plate 158 are disposed on the gate insulation layer 140. In this case, the driving gate electrode 124 overlaps at least a part of the driving semiconductor 155, and specifically, the channel area 153 of the driving semiconductor 155.

The interlayer insulation layer 160 that covers the driving gate electrode 124 is disposed on the gate insulation layer 140. Like the gate insulation layer 140, the interlayer insulating layer 160 may be made of a silicon nitride or a silicon oxide. The gate insulation layer 140 and the interlayer insulating layer 160 include a first contact hole 163 and a second contact hole 165 that expose the source area 153 and the drain area 154 of the driving semiconductor layer 155.

The driving source electrode 173, the driving drain electrode 175, the data line 171, the common power line 172, and the capacitor plate 178 are disposed on the interlayer insulating layer 160. The driving source electrode 173 and the driving drain electrode 175 are respectively connected with the source area 152 and the drain area 154 of the driving semiconductor 155 through the first contact hole 163 and the second contact hole 165.

The insulation layer 180 that covers the driving source electrode 173 and the driving drain electrode 175 is disposed on the interlayer insulating layer 160. The insulation layer 180 may include a polyacrylic or polyimide organic material.

The insulation layer 180 includes the contact hole 185. The first electrode 191 is disposed on the insulation layer 180. The first electrode 191 may be a pixel electrode. The first electrode 191 is connected with the driving drain electrode 175 through the contact hole 185.

The barrier 380 is disposed on the insulation layer 180. The barrier 380 includes the first barrier 381 and the second barrier 382, and an upper area of the second barrier 382 is doped with fluorine. The area including fluorine in the second barrier 382 is an upper area, and a side area of the second barrier rub 382 is not doped with fluorine. Thus, the upper area of the barrier 380 has hydrophobicity, and the side surface of the barrier 380 has hydrophilicity. Thus, when the light emitting element layer 370 is formed in the opening of the barrier 380 using an inkjet process, an inkjet material can be prevented from overflowing out of the opening of the barrier 380 while making the inkjet material spread well in the opening.

The first barrier 381 and the second barrier 382 may include the same material or may include different materials. The sum of a height/thickness of the first barrier 381 and a height/thickness of the second barrier 382 in a direction perpendicular to the substrate 110 may be in a range of about 0.5 μm to about 2 μm. A thickness of an area doped with fluorine in the second barrier 382 may be in a range of about 10 nm to about 100 nm. For example, a ratio of the thickness of the fluorine-doped area with respect to the thickness of the entire barrier 380 may be in a range of about 0.05% to about 20%.

In the drawing, the barrier 380 is illustrated as a multi-layer including the first barrier 381 and the second barrier 382, but as shown in FIG. 5, the barrier 380 may be provided as a single layer including a fluorine-doped portion. In an embodiment, an upper surface of the barrier 380 is doped with fluorine and a side surface thereof has hydrophilicity.

The light emitting element layer 370 overlaps the first electrode 191, and the second electrode 270 overlaps the light emitting element layer 370. The light emitting element layer 370 may include at least one of a hole injection layer (HIL), a hole transport layer (HTL), an emission layer, an electron transport layer (ETL), and an electron injection layer (EIL). The second electrode 270 may be a common electrode. The light emitting element E1 includes the first electrode 191, the light emitting element layer 370, and the second electrode 270.

FIG. 8 to FIG. 13 show cross-sectional views of structures formed in a process for manufacturing the light emitting element according to an embodiment. A key feature is focused on a manufacturing method of a barrier 380, and therefore a process for manufacturing the barrier 380 will be mainly described.

In FIG. 8 to FIG. 13, the substrate 110, the first electrode 191, and the barrier 380 are schematically illustrated. Various structures including the driving transistor T2 may be included between the first electrode 191 and the substrate 110, as illustrated in FIG. 7. Elements and/or structures shown in FIG. 6 and/or FIG. 7 may be included the structure illustrated in one of more of FIG. 8, FIG. 9, FIG. 10, FIG. 11, FIG. 12, and FIG. 13.

Figure 8:
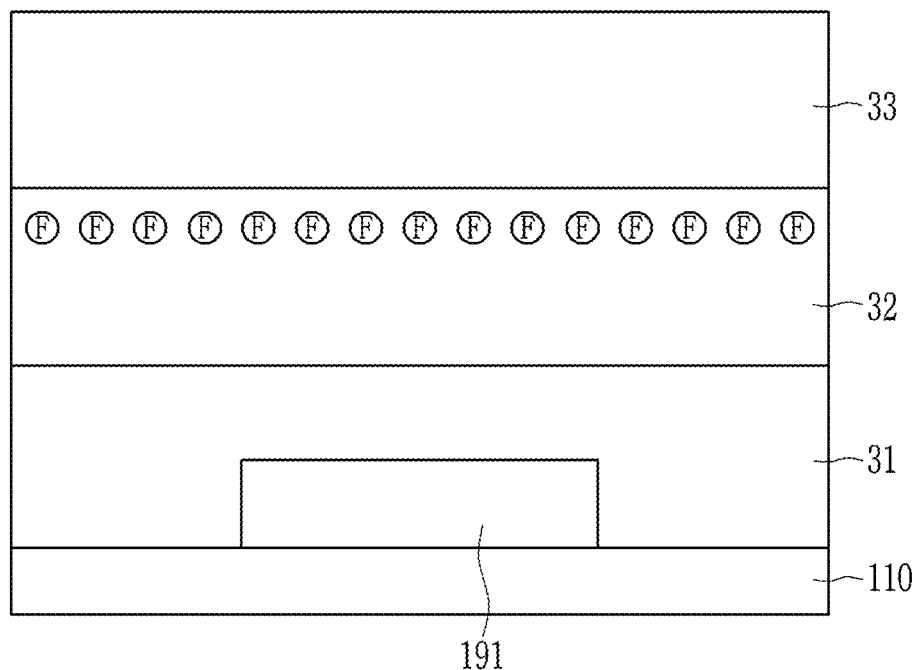
FIG. 8, FIG. 9, FIG. 10, FIG. 11, FIG. 12, and FIG. 13 are schematic cross-sectional views of structures formed in a method for manufacturing a light emitting element of a display device according to an embodiment.

Referring to FIG. 8, a third layer 31 (or intermediate layer 31), a second layer 32 (or material layer 32), and a first layer 33 (or cover/protection/sacrificial layer 33) are sequentially stacked on a thin film transistor display panel (including the substrate 110) where the first electrode 191 is formed. In an embodiment, the third layer 31 and the first layer 33 may include the same material and may have hydrophilicity. For example, the third layer 31 and the first layer 33 may include a negative photoresist layer PR.

The second layer 32 disposed between the third layer 31 and the first layer 33 includes fluorine. An upper area of the second layer 32 is doped with fluorine. A thickness of the fluorine-doped area in the second layer 32 may be in a range of about 10 nm to about 100 nm. The second layer 32 may also include the same negative photoresist (PR) material as the third layer 31 and the first layer 33. However, unlike the other layers, an upper area of the second layer 32 is doped with fluorine. Referring to FIG. 8, the third layer 31, the second layer 32, and the first layer 33 are sequentially stacked without an opening. In an embodiment, a material of the third layer 31 is coated and soft-baked, a material of the second layer 32 is coated and soft-baked, and then a material of the first layer 33 is coated and soft-baked such that each layer can be formed.

Figure 9:
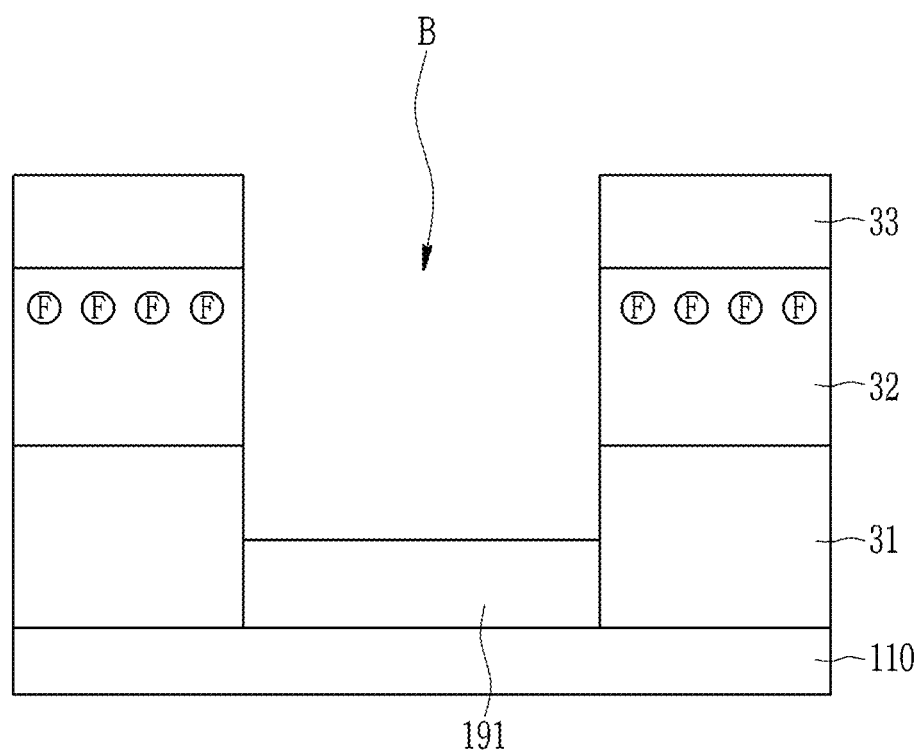

Next, referring to FIG. 9, an opening B is formed by exposing and developing the first layer 33, the second layer 32, and the third layer 31. The opening B is formed in portions of the layers 31, 32, and 33 that overlap the first electrode 191. The first electrode 191 is (at least partially) exposed by the opening B.

When the third layer 31, the second layer 32, and the first layer 33 are developed to form the opening B, the first layer 33 disposed topmost is also partially etched such that a thickness of the first layer 33 in the direction perpendicular to the substrate 110 is reduced. In addition, when forming the opening B, residuals of the third layer 31, the second layer 32, and the first layer 33 may remain rather than being completely removed. The residuals are generated through the exposure and developing processes (e.g., using a photoresist and/or a mask).

Figure 10:
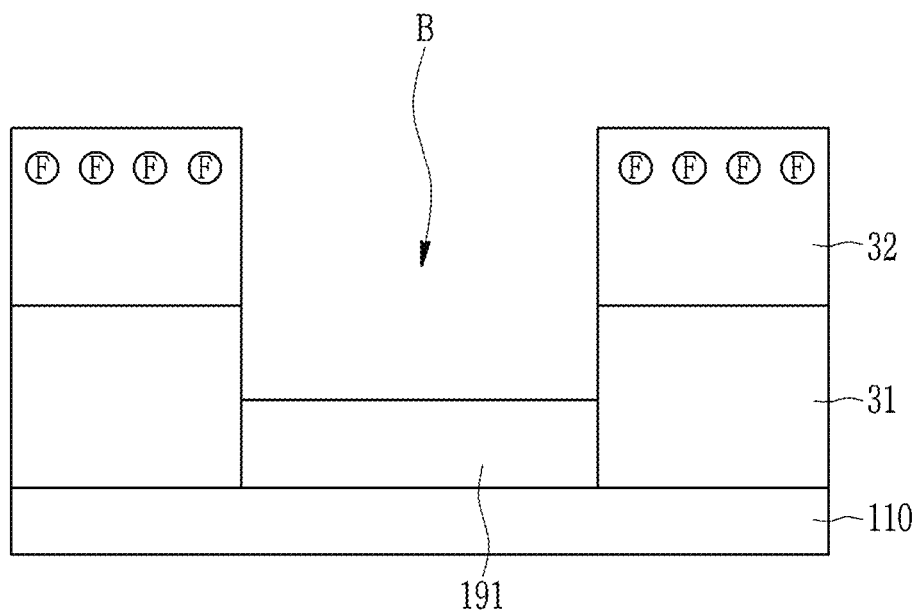

Next, referring to FIG. 10, the photoresist residuals of the layers 31, 32, and 33 in the opening B are removed through a plasma treatment. The plasma treatment may be carried out using at least one of $O_2$, Ar, $N_2$, $NF_3$, and $CF_4$.

The photoresist residuals in the opening B are removed through the plasma treatment. The first layer 33 is substantially or completely removed through the plasma treatment. Thus, the second layer 32 of which the upper portion is doped with fluorine is exposed. A side surface of the remaining portions of the layers 31 and 32 defines a boundary of the opening B and has hydrophilicity due to the plasma treatment. The remaining portions of the layers 31 and 32 form the barriers 381 and 382.

That is, the fluorine-doped second layer 32 is exposed and the barrier 380 including the second barrier 382 and the first barrier 381 is formed through the plasma treatment.

Figure 11:
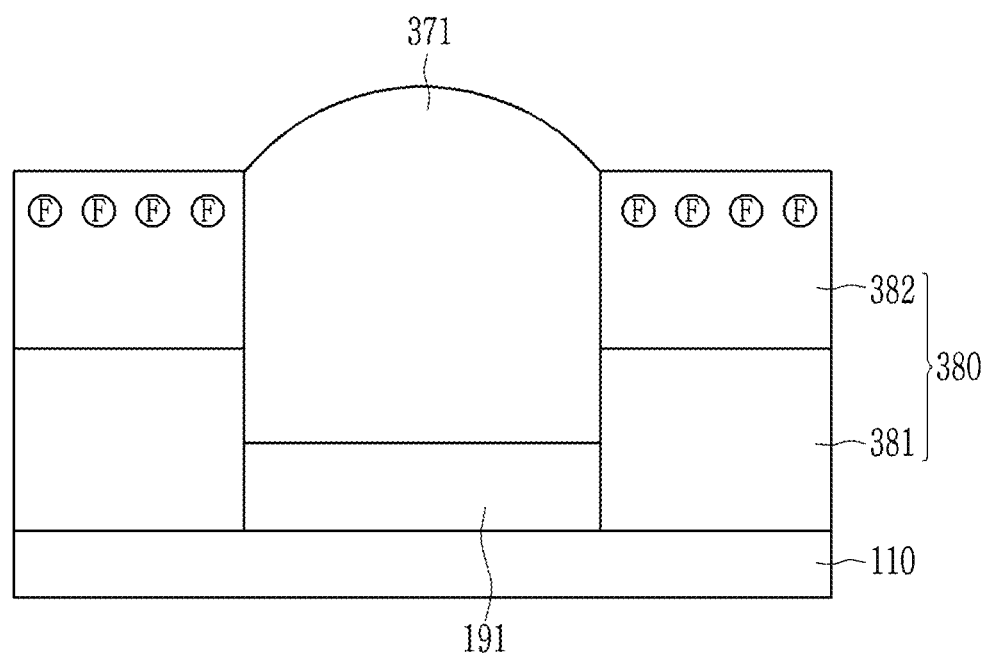

Next, referring to FIG. 11, an inkjet material 371 is dripped into the opening B of the barrier 380 using an inkjet process. Since the side surface of the barrier 380 has hydrophilicity, the inkjet material 371 spreads well but does not overflow the opening B partitioned by the barrier 380 because the upper surface of the barrier 380 has hydrophobicity. The inkjet material 371 may be a light emitting element layer material. That is, the inkjet material 371 may be/include at least one of the electron injection layer (EIL), the electron transport layer (ETL), the emission layer, the hole injection layer (HIL), and the hole transport layer (HTL).

Figure 12:
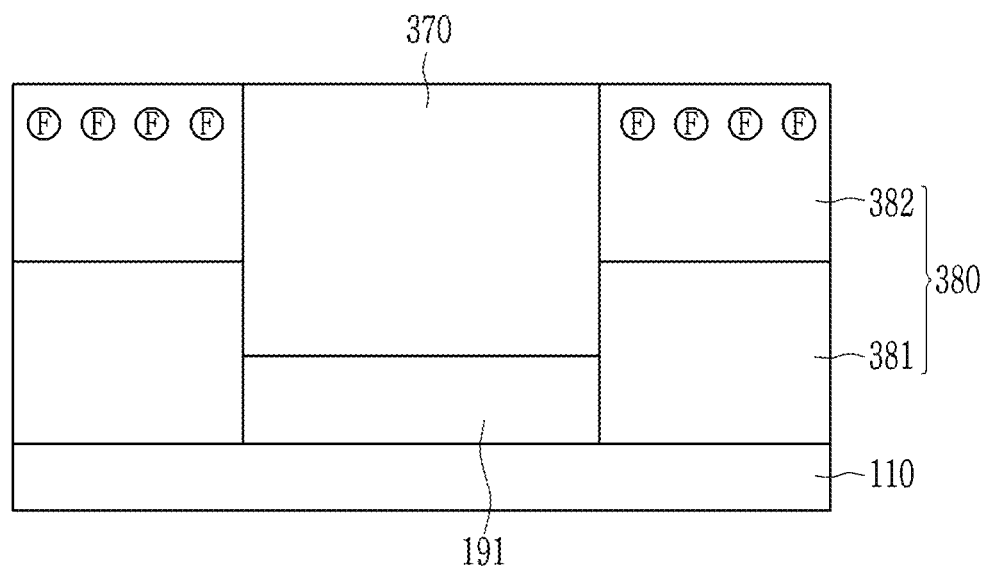

Next, referring to FIG. 12, the light emitting element layer 370 is formed by heating the inkjet material 371. In FIG. 11, only the light emitting element layer 370 is illustrated, but the light emitting element layer 370 may include the electron injection layer (EIL), the electron transport layer (ETL), the emission layer, the hole injection layer (HIL), and the hole transport layer (HTL), and each layer may be formed stepwise by an individual inkjet process. Since a solvent included in the inkjet material 371 is evaporated during the heating process, the light emitting element layer 370 may have a smaller volume than the discharged inkjet material 371.

Figure 13:
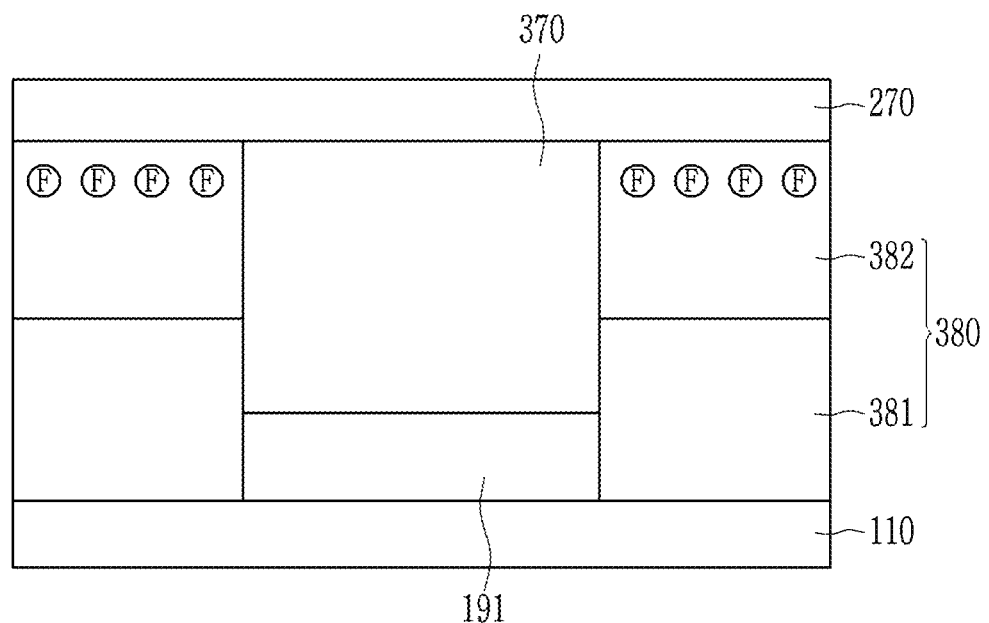

Next, referring to FIG. 13, the second electrode 270 is formed on the light emitting element layer 370. The second electrode 270 may be a common electrode.

It has been described above that the barrier 380 is formed through exposure after stacking the third layer 31, the second layer 32, and the first layer 33, but the third layer 31 may be unnecessary in an embodiment. That is, the second layer 32 of which the upper surface includes fluorine and the first layer 33 that does not include fluorine are deposited, and then the same process as shown in FIG. 10 to FIG. 12 is formed, such that a display device can be manufactured.

Figure 14:
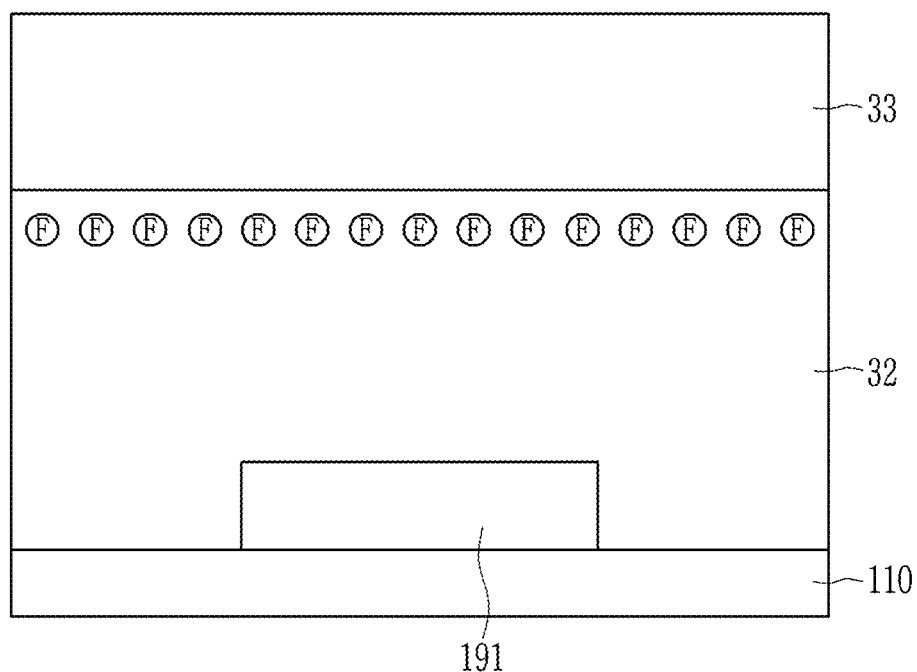
FIG. 14, FIG. 15, and FIG. 16 are schematic cross-sectional views of structures formed in a method for manufacturing a display device according to an embodiment.
Figure 15:
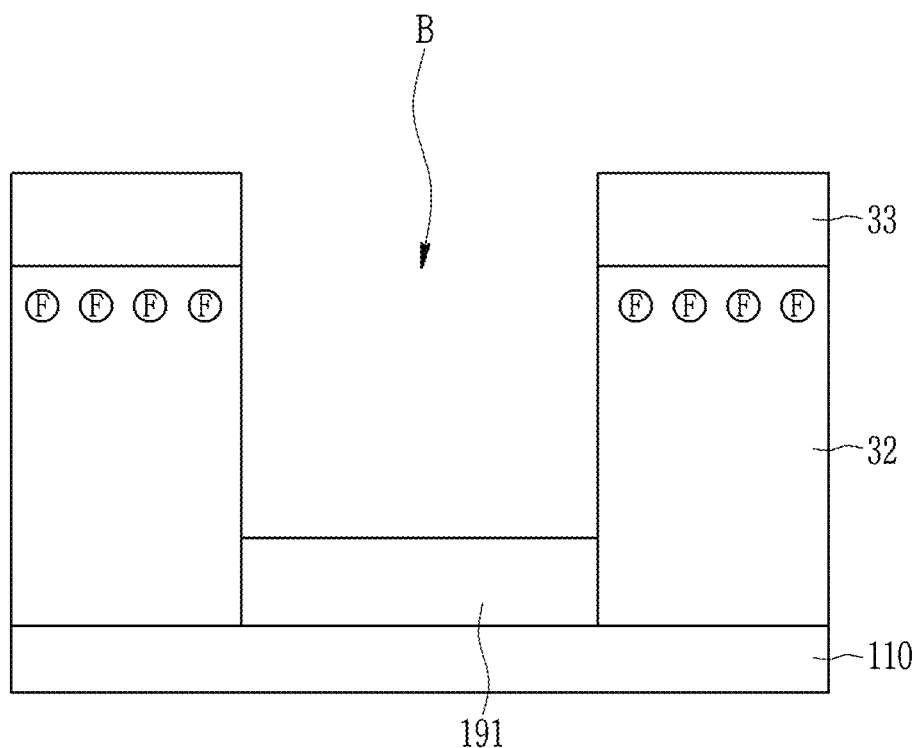
Figure 16:
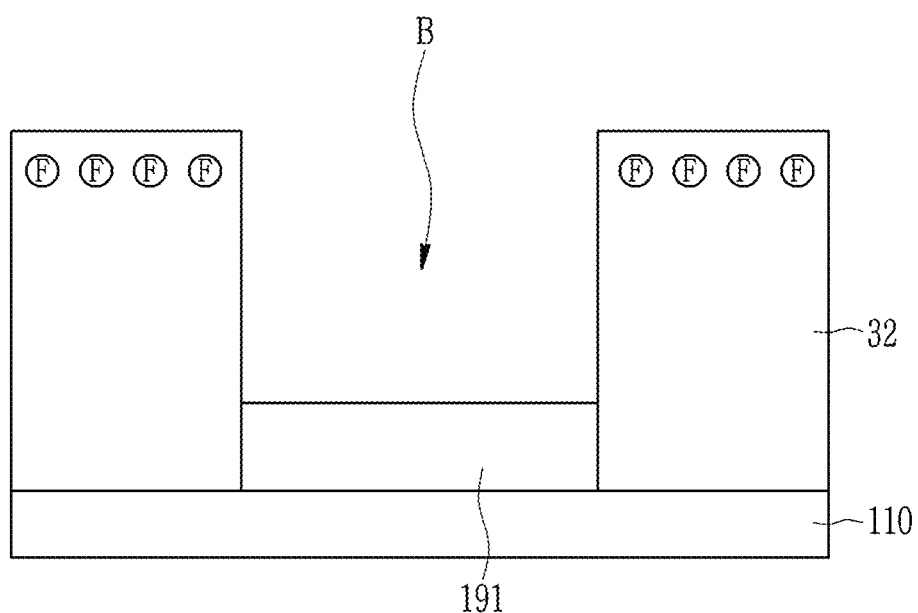

Processes shown in FIG. 14 to FIG. 16 may replace the processes shown in FIG. 8 to FIG. 10. Referring to FIG. 14 to FIG. 16, the processes are substantially the same as or analogous to those discussed with reference to FIG. 8 to FIG. 10, except that the stacking process of the third layer 31 is not performed.

When the opening of the barrier 380 is formed through exposure and development processes using the photoresist material in the manufacturing process of the barrier 380, the plasma treatment is performed to remove a residual of the photoresist. When the plasma treatment is carried out, a surface is changed to be hydrophilic, thereby eliminating liquid repellency due to hydrophobicity. If the first layer 33 disposed topmost is doped with fluorine, the hydrophobic effect (due to fluorine doping) may be lost in the exposure/development process and the plasma treatment, and hydrophilic property may be caused by the exposure/development process and the plasma treatment. As a result, when the light emitting element layer 370 is formed through the inkjet process in the opening of the light emitting display device that includes the hydrophilic barrier 380, the inkjet material may overflow out of the opening of the barrier rub 380.

However, according to an embodiment, the barrier 380 is formed using a multi-layered structure (including a cover layer), and the second layer 32 disposed in the middle in the manufacturing process is doped with fluorine. Thus, only the first layer 33 disposed topmost is completely or substantially removed during the plasma treatment process, and the second layer 32 is protected by the first layer 33, thereby maintaining hydrophobicity from fluorine doping.

In addition, a side surface of the third layer 31 and a side surface of the second layer 32 have hydrophilicity due to the plasma treatment so that the inkjet material spreads well in the opening B.

As described, according to embodiments, the barrier 380 is formed using a multi-layered structure (including a cover layer) and then etched to form the opening, and then a fluorine-doped portion of a layer disposed in the middle in the multi-layered structure is exposed such that the upper surface of the barrier 380 may maintain hydrophobicity even though the plasma treatment is carried out. That is, a barrier

380 of which an upper surface has hydrophobicity and a side surface of an opening B has hydrophilicity may be provided. Thus, when an emission layer is formed through an inkjet process, the inject material can sufficiently fill the opening B, and the inkjet material may not overflow out of the barrier 380.

While example embodiments have been described, practical embodiments are not limited to the described embodiments. Embodiments are intended to cover various modifications and equivalent arrangements within the spirit and scope defined by the appended claims.

What is claimed is:

1. A display device comprising:
a substrate;
a thin film transistor disposed on the substrate;
a first electrode electrically connected to the thin film transistor;
a second electrode overlapping the first electrode; and
a barrier having a first portion and a second portion,
wherein the second portion is disposed between the first portion and the second electrode and is fluorine-doped,
wherein a side surface of the first portion is part of a boundary of an opening of the barrier and is hydrophilic,
wherein the opening of the barrier is disposed between the first electrode and the second electrode, and
wherein the first portion includes a negative photoresist material.

2. The display device of claim 1, wherein a thickness of the second portion in a direction perpendicular to the substrate is in a range of 10 nm to 100 nm.

3. The display device of claim 1, wherein the first portion is not fluorine-doped, and wherein a ratio of a thickness of the second portion in a direction perpendicular to the substrate with respect to a thickness of the barrier in a direction perpendicular to the substrate is in a range of 0.05% to 20%.

4. The display device of claim 1, wherein a face of the second portion directly contacts the second electrode and is fluorine-doped.

5. The display device of claim 1, wherein the first portion and the second potion comprise a same material.

6. The display device of claim 1, wherein the first portion comprises a first material, and wherein the second portion comprises a second material different from each of fluorine and the first material.

7. A display device comprising:
a substrate;
a thin film transistor disposed on the substrate;
a first electrode electrically connected to the thin film transistor;
a second electrode overlapping the first electrode; and
a barrier having a first portion and a second portion,
wherein the second portion is disposed between the first portion and the second electrode and is fluorine-doped,
wherein a side surface of the first portion is part of a boundary of an opening of the barrier and is hydrophilic,
wherein the opening of the barrier is disposed between the first electrode and the second electrode, and
wherein at least one of the first portion and the second portion includes a negative photoresist material.

8. The display device of claim 1, wherein the first portion partially covers a top surface of the first electrode.

* * * * *